United States Patent
Lee

(10) Patent No.: US 10,521,340 B2
(45) Date of Patent: Dec. 31, 2019

(54) MEMORY SYSTEM AND OPERATING METHOD THEREOF

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/040,213

(22) Filed: Jul. 19, 2018

(65) Prior Publication Data

US 2019/0196958 A1 Jun. 27, 2019

(30) Foreign Application Priority Data

Dec. 21, 2017 (KR) ........................ 10-2017-0176874

(51) Int. Cl.
| | |
|---|---|
| *G06F 12/121* | (2016.01) |
| *G06F 12/02* | (2006.01) |
| *G06F 11/10* | (2006.01) |
| *G06F 3/06* | (2006.01) |
| *G11C 16/26* | (2006.01) |
| *G06F 13/16* | (2006.01) |
| *G06F 13/18* | (2006.01) |

(52) U.S. Cl.
CPC .......... *G06F 12/0246* (2013.01); *G06F 3/061* (2013.01); *G06F 3/064* (2013.01); *G06F 3/0659* (2013.01); *G06F 3/0679* (2013.01); *G06F 11/1068* (2013.01); *G06F 13/1642* (2013.01); *G06F 13/18* (2013.01); *G11C 16/26* (2013.01); *G06F 12/121* (2013.01); *G06F 2212/7205* (2013.01)

(58) Field of Classification Search
None
See application file for complete search history.

(56) References Cited

U.S. PATENT DOCUMENTS

| | | | |
|---|---|---|---|
| 9,727,488 B1* | 8/2017 | Drerup | .................. G06F 12/128 |
| 2018/0101478 A1* | 4/2018 | Drerup | ................ G06F 12/0864 |

FOREIGN PATENT DOCUMENTS

| | | |
|---|---|---|
| KR | 1020150140496 | 12/2015 |
| KR | 1020150142792 | 12/2015 |

* cited by examiner

*Primary Examiner* — Brian R Peugh
(74) *Attorney, Agent, or Firm* — IP & T Group LLP

(57) ABSTRACT

A memory system includes a plurality of memory blocks, first and second queues, and a controller suitable for queuing first victim blocks whose error information value is equal to or greater than a threshold value among the memory blocks in the first queue, queuing second victim blocks whose read count is equal to or greater than a threshold value in the second queue, rearranging a priority order of the first and second victim blocks queued in the first and second queues based on read reclaim values, and performing a read reclaim operation on the first and second victim blocks based on the priority order.

20 Claims, 8 Drawing Sheets

MEMORY SYSTEM AND OPERATING METHOD THEREOF

CROSS-REFERENCE TO RELATED APPLICATIONS

The present application claims priority under 35 U.S.C. § 119(a) to Korean Patent Application No. 10-2017-0176874, filed on Dec. 21, 2017, the disclosure of which is incorporated herein by reference in its entirety.

BACKGROUND

1. Field

Various exemplary embodiments of the present invention relate to a memory system. Particularly, the embodiments relate to the memory system that controls a read reclaim operation, and an operating method of the memory system.

2. Description of the Related Art

The computer environment paradigm has changed to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems that have no moving parts provide excellent stability, durability, high information access speed, and low power consumption. Examples of memory systems having such advantages include universal serial bus (USB) memory devices, memory cards having various interfaces, and solid state drives (SSD).

SUMMARY

Various embodiments of the present invention are directed to a memory system that divides and manages a victim block which is a target for a read reclaim operation according to causes of occurrence and performs the read reclaim operation on the victim block according to priority order, an operating method of the memory system.

In accordance with an embodiment of the present invention, a memory system includes: a plurality of memory blocks; first and second queues; and a controller suitable for queuing first victim blocks whose error information value is equal to or greater than a threshold value among the memory blocks in the first queue, queuing second victim blocks whose read count is equal to or greater than a threshold value in the second queue, rearranging a priority order of the first and second victim blocks queued in the first and second queues based on read reclaim values, and performing a read reclaim operation on the first and second victim blocks based on the priority order.

In accordance with an embodiment of the present invention, an operating method of a memory system includes: queuing first victim blocks whose error information value is equal to or higher than a threshold value among a plurality of memory blocks in a first queue and queuing second victim blocks whose read count is equal to or higher than a threshold value in a second queue; rearranging a priority order of the first and second victim blocks queued in the first and second queues based on read reclaim values; and performing a read reclaim operation on the first and second victim blocks based on the priority order.

In accordance with an embodiment of the present invention, a memory controller includes a first queue suitable for queuing first victim blocks among a plurality of memory blocks; a second queue suitable for queuing second victim blocks among the plurality of memory blocks; and a controller suitable for: queuing the first victim blocks in the first queue, queuing the second victim blocks in the second queue, rearranging a priority order of the first and second victim blocks queued in the first and second queues based on read reclaim values, and performing a read reclaim operation on the first and second victim blocks based on the priority order.

DETAILED DESCRIPTION

Figure 1:
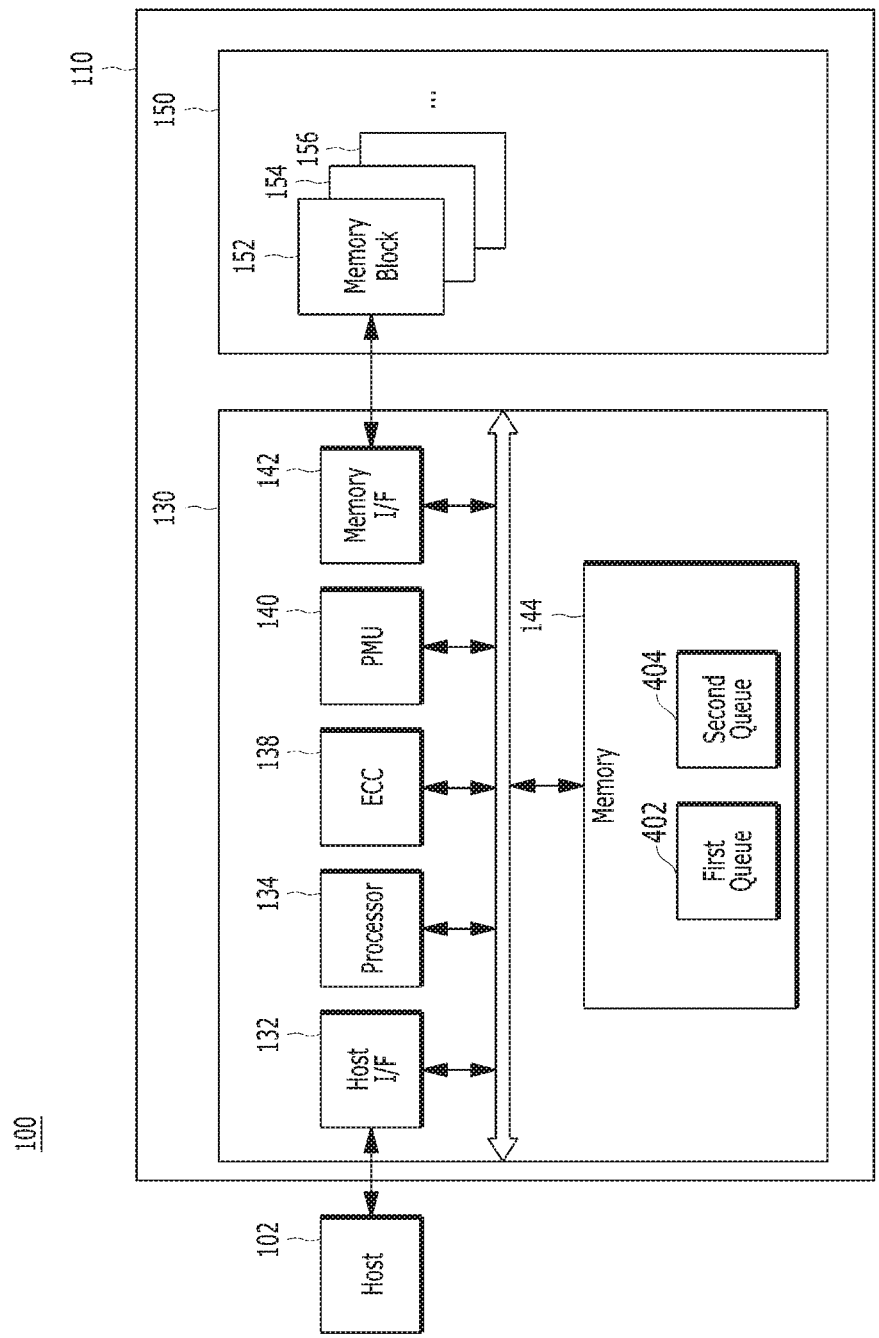
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale, and in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include portable electronic devices such as mobile phones, MP3 players, and laptop computers or non-portable electronic devices such as desktop computers, gaming devices, televisions (TV), and projectors.

The host 102 may include at least one operating system (OS). The OS may manage and control overall functions and operations of the host 102, and provide an interface between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user.

For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service with users and a power saving function of a system may include Android, iOS and Windows Mobile. The host 102 may include a plurality of OSs, and may execute an OS to perform an operation corresponding to a user's request on the memory system 110. Here, the host 102 may provide a plurality of commands corresponding to a user's request with the memory system 110, and thus the memory system 110 may perform certain operations corresponding to the plurality of commands, that is, corresponding to the user's request.

The memory system 110 may store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, a compact flash (CF) card, a smart media card (SMC), a personal computer memory card international association (PCMCIA) card and a memory stick. The MMC may include an embedded MMC (eMMC), reduced size MMC (RS-MMC), and micro-MMC. The SD card may include a mini-SD card and micro-SD card.

The memory system 110 may include various types of storage devices. Non-limiting examples of storage devices included in the memory system 110 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and a flash memory.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In another example, the controller 130 and the memory device 150 may be integrated as one semiconductor device to constitute a memory card. For example, the controller 130 and the memory device 150 may constitute a memory card such as a personal computer memory card international association (PCMCIA) card, CF card, smart media card (SMC), memory stick, MMC including RS-MMC and micro-MMC, SD card including mini-SD, micro-SD and SDHC, or UFS device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain stored data even though power is not supplied. The memory device 150 may store data provided from the host 102 through a write operation, and provide data stored therein to the host 102 through a read operation. In an embodiment, the memory device 150 may include a plurality of memory dies (not shown), each memory die may include a plurality of planes (not shown), and each plane may include a plurality of memory blocks 152 to 156. Each of the memory blocks 152 to 156 may include a plurality of pages, and each of the pages may include a plurality of memory cells coupled to a word line. In an embodiment, the memory device 150 may be a flash memory having a 3-dimensional (3D) stack structure.

The controller 130 may control the memory device 150 in response to a request from the host 102. For example, the controller 130 may provide data read from the memory device 150 with the host 102, and store data provided from the host 102 into the memory device 150. For this operation, the controller 130 may control read, write, program, and erase operations of the memory device 150.

More specifically, the controller 130 may include a host interface (I/F) 132, a processor 134, an error correction code (ECC) component 138, a power management unit (PMU) 140, a memory interface (I/F) 142, and a memory 144 all operatively coupled via an internal bus. The memory 144 may include a first queue 402 and a second queue 404.

The host interface 132 may process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via a firmware, that is, a host interface layer (HIL) for exchanging data with the host 102.

The ECC component 138 may correct error bits of data to be processed by the memory device 150 and may include an ECC encoder and an ECC decoder. The ECC encoder may perform an error correction encoding on data to be programmed into the memory device 150 to generate data to which a parity bit is added. The data including the parity bit may be stored in the memory device 150. The ECC decoder may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is greater than a threshold value of correctable error bits, the ECC component 138 may not correct the error bits, and may output an error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited thereto. The ECC component 138 may include all circuits, modules, systems or devices for error correction.

The PMU 140 may provide and manage power of the controller 130.

The memory interface 142 may serve as a memory or storage interface for interfacing the controller 130 and the memory device 150 such that the controller 130 may control the memory device 150 in response to a request from the host 102. When the memory device 150 is a flash memory or specifically a NAND flash memory, the memory interface 142 may be NAND flash controller (NFC) and may generate a control signal for the memory device 150 and process data to be provided with the memory device 150 under the control of the processor 134. The memory interface 142 may work as an interface (e.g., a NAND flash interface) for processing a command and data between the controller 130 and the memory device 150. Specifically, the memory interface 142 may support data transfer between the controller 130 and the memory device 150. The memory interface 142 may be driven via a firmware, that is, a flash interface layer (FIL) for exchanging data with the memory device 150.

The memory 144 may serve as a working memory of the memory system 110 and the controller 130, and store data for driving the memory system 110 and the controller 130. The controller 130 may control the memory device 150 to perform read, program, and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be a volatile memory. For example, the memory 144 may be a static random access memory (SRAM) or dynamic random access memory (DRAM). The memory 144 may be disposed within or external to the controller 130. FIG. 1 exemplifies the memory 144 disposed within the controller 130. In an embodiment, the memory 144 may be an external volatile memory having a memory interface transferring data between the memory 144 and the controller 130.

As described above, the memory 144 may include a program memory, a data memory, a write buffer or cache, a read buffer or cache, a data buffer or cache and a map buffer or cache to store data required to perform data write and read operations between the host 102 and the memory device 150 and data required for the controller 130 and the memory device 150 to perform these operations.

The processor 134 may control the overall operations of the memory system 110. The processor 134 may drive firmware to control the overall operations of the memory system 110. The firmware may be referred to as flash translation layer (FTL).

For example, the controller 130 may perform an operation requested by the host 102 on the memory device 150 through the processor 134, which is implemented as a microprocessor, a central processing unit (CPU), or the like. In other words, the controller 130 may perform a command operation corresponding to a command received from the host 102. Herein, the controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command, or a set feature command as a set command.

Also, the controller 130 may perform a background operation on the memory device 150 through the processor 134, which is realized as a microprocessor or a CPU. Examples of the background operation may include an operation of copying and processing data stored in some memory blocks among the memory blocks 152 to 156 of the memory device 150 into other memory blocks, e.g., a garbage collection (GC) operation. Examples of the background operation may include an operation of performing swapping between the memory blocks 152 to 156 of the memory device 150 or between the data of the memory blocks 152 to 156, e.g., a wear-leveling (WL) operation. Examples of the background operation may include an operation of storing the map data stored in the controller 130 in the memory blocks 152 to 156 of the memory device 150, e.g., a map flush operation. Examples of the background operation may include an operation of managing bad blocks of the memory device 150, e.g., a bad block management operation of detecting and processing bad blocks among the memory blocks 152 to 156 included in the memory device 150.

Further, the controller 130 may perform a plurality of command executions corresponding to a plurality of commands received from the host 102, e.g., a plurality of program operations corresponding to a plurality of write commands, a plurality of read operations corresponding to a plurality of read commands, and a plurality of erase operations corresponding to a plurality of erase commands, in the memory device 150. Also, the controller 130 may update meta-data, (particularly, map data) according to the command executions.

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation performing with more reliability is needed. Hereafter, the memory device of the memory system in accordance with the embodiment of the present invention is described in detail with reference to FIGS. 2 to 3.

Figure 2:
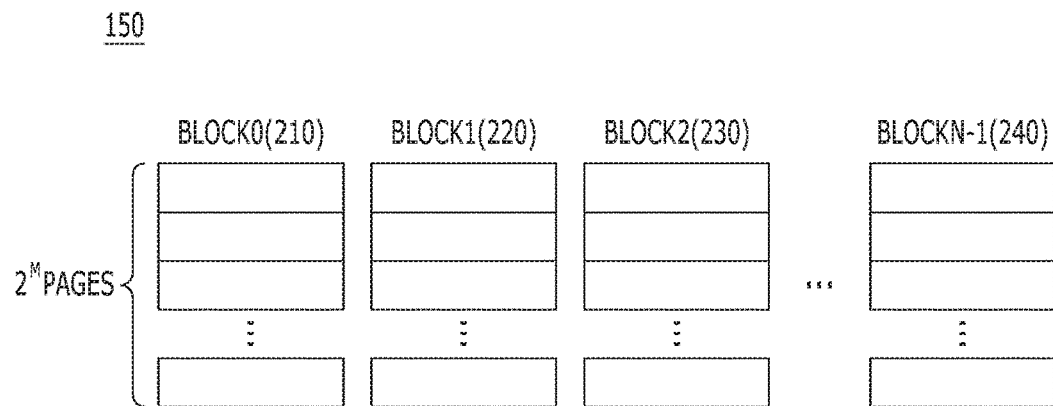
FIG. 2 is a schematic diagram illustrating an exemplary configuration of a memory device employed in the memory system shown in FIG. 1.
Figure 3:
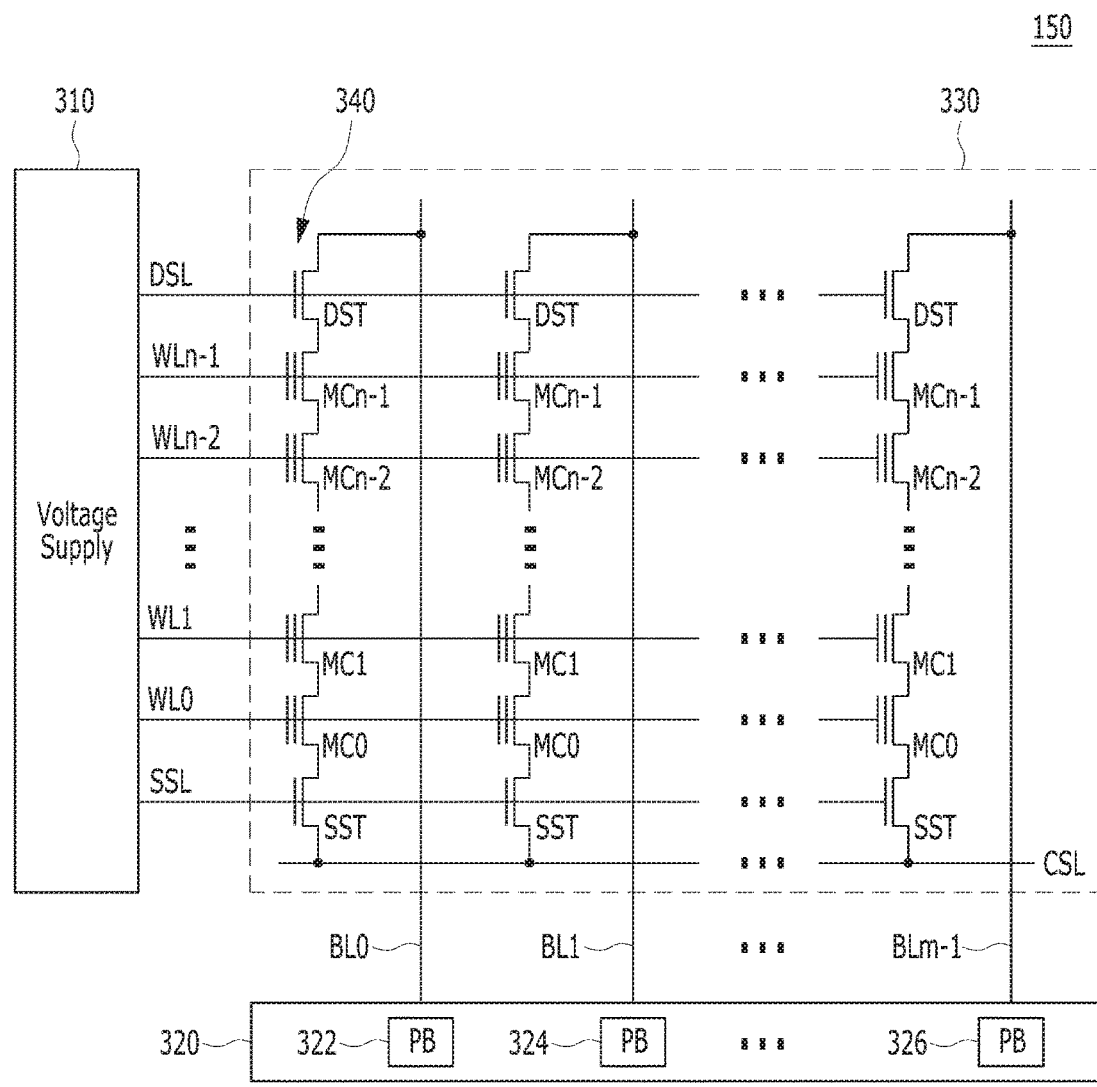
FIG. 3 is a circuit diagram illustrating an exemplary configuration of a memory cell array of a memory block in the memory device shown in FIG. 1.

FIG. 2 is a schematic diagram illustrating the memory device 150 and FIG.3 is a circuit diagram illustrating an exemplary configuration of a memory cell array of a memory block 330 in the memory device 150.

Referring to FIG. 2, the memory device 150 may include a plurality of memory blocks BLOCK0 210 to BLOCKN-1 240. Each of the blocks BLOCK0 210 to BLOCKN-1 240 may include a plurality of pages, for example, $2^M$ pages, the number of which may vary according to circuit design. Herein, although it is described that each of the memory blocks include $2^M$ pages, each of the memory blocks 210 to 240 may include M pages as well. Each of the pages may include a plurality of memory cells that are coupled to a plurality of word lines WL.

Also, memory cells included in the respective memory blocks BLOCK0 210 to BLOCKN-1 240 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells each storing one-bit data and may generally have high data computing performance and high durability. The MLC memory blocks may include a plurality of pages which are embodied by memory cells each storing multi-bit data (for example, 2 or more bits), and may generally have a larger data storage space than the SLC memory block, that is, higher integration density. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data.

Although the embodiment of the present invention exemplarily describes, for convenience, that the memory device 150 may be a flash memory such as a NAND flash memory, it may also be implemented by various other memory devices such as a phase change random access memory (PCRAM), a resistive random access memory (RRAM or ReRAM), a ferroelectrics random access memory (FRAM), a spin transfer torque magnetic random access memory (STT-RAM or STT-MRAM)), or the like.

The memory blocks 210, 220, 230, and 240 may store the data transferred from the host 102 through a program operation, and transfer data stored therein to the host 102 through a read operation.

Referring to FIG. 3, the memory block 330 may include a plurality of cell strings 340 coupled to a plurality of corresponding bit lines BL0 to BLm-1. The cell string 340 of each column may include one or more drain select transistors DST and one or more source select transistors SST. Between the source and drain select transistors SST and DST, a plurality of memory cells MC0 to MCn-1 may be coupled in series. In an embodiment, each of the memory cell transistors MCO to MCn-1 may be embodied by an MLC capable of storing data of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the present disclosure is not limited thereto. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage, and a pass voltage to supply to the word lines according to an operation mode. A control circuit (not illustrated) may control the voltage generation operation of the voltage supply 310. Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from a certain memory cell array of the memory block 330. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers (PBs) 322 to 326 respectively corresponding to columns (or bit lines) or column pairs (or bit line pairs). Each of the page buffers 322 to 326 may include a plurality of latches (not illustrated).

A read disturbance phenomenon refers to a phenomenon in which a read operation is performed on a plurality of pages included in a specific block and a cell-level of another page included in the block increases. When the read disturbance phenomenon is accumulated, error correction capability of the ECC 138 may be exceeded. In this case, the read reclaim operation refers to an operation of storing valid pages stored in a victim block whose read count or error information value is equal to or greater than a threshold value in a target block and performing an erase operation on remaining pages included in the victim block. Thus, unrecoverable errors may be prevented from occurring through the read reclaim operation.

In a conventional memory system, when any one of a read count and an error information value of a specific block is equal to or greater than the threshold value, the controller 130 of FIG. 1 may detect the block as a victim block. The controller 130 may queue address information of the victim block in a read reclaim queue in order in which the victim block is detected. The controller 130 may perform the read reclaim operation on a firstly queued victim block in the read reclaim queue in accordance with a general queue management manner, e.g., a first in first out (FIFO) manner.

Generally, when the address information of the victim block is queued into the read reclaim queue, characteristics of the victim blocks are not considered. That is, when the controller performs the read reclaim operation in the FIFO manner, the address information of the victim block is queued in the read reclaim queue without classifying the victim block whose read count is equal to or greater than the threshold value and the victim block whose error information value is equal to or greater than the threshold value.

As described above, in a conventional memory system, the read reclaim operation is performed according to the order in which the address information is queued. Accordingly, the read reclaim operation may not be performed such that a damage degree of the victim block is considered when the address information of the victim block is queued in the read reclaim queue. For example, when the read count of a specific victim block is much greater than the read count of another victim block, a damage degree of a victim block having a greater read count may be higher. Nevertheless, since a queuing order of the victim block whose damage degree is higher is slow, the read reclaim operation may be performed later on the victim block.

According to an embodiment of the present invention, the read reclaim operation may be preferentially performed on the victim block having a higher damage degree by comprehensively considering a time at which the read count, the error information value, and the address information of the victim block are queued in the read reclaim queue.

Figure 4:
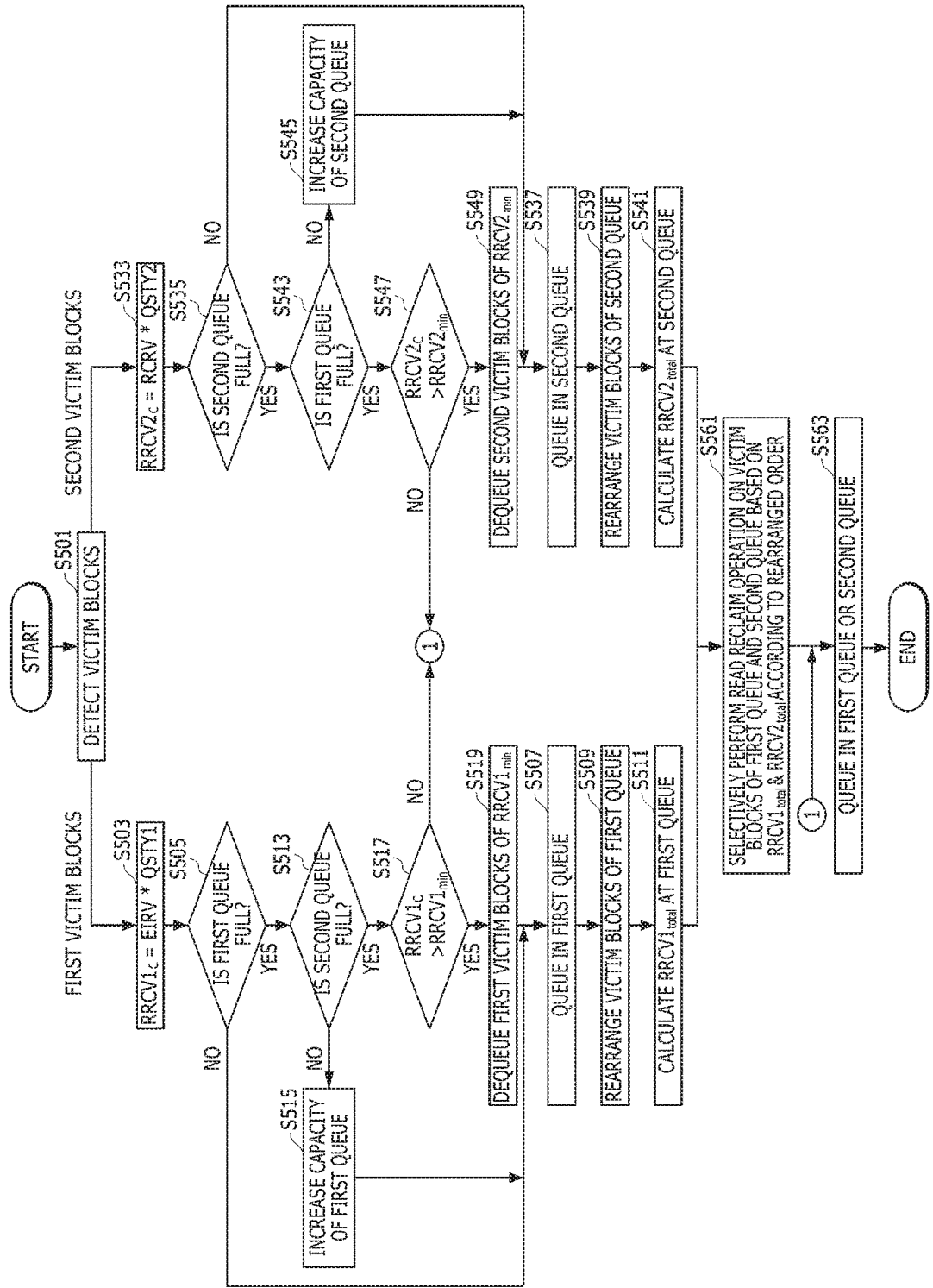
FIG. 4 is a flowchart illustrating a read reclaim operation in accordance with an embodiment of the present invention.

FIG. 4 is a flowchart illustrating a read reclaim operation in accordance with an embodiment of the present invention. The controller 130 of FIG. 1 may control the memory device 150 to perform the read reclaim operation.

Referring to FIG. 4, at step S501, the processor 134 may detect victim blocks which are targets for the read reclaim operation among the memory blocks 152 to 156 included in the memory device 150. The processor 134 may detect blocks whose error information values are equal to or greater than a threshold value as first victim blocks. The error information values may be any one of a number of error bits of a memory block and a number of error steps of a memory block. Further, the processor 134 may detect blocks whose read counts are equal to or greater than a threshold value as second victim blocks. The detected first and second victim blocks may be queued in the first and second queues 402 and 404, respectively.

The number of error steps may represent a number of decoding times required for correcting errors of the first victim blocks in the ECC unit 138.

At step S503, the processor 134 may calculate a first read reclaim value $RRCV1_c$ of each of the first victim blocks according to Equation 1 below. The first read reclaim value $RRCV1_c$ may represent a priority order of the read reclaim operation performed on each of the first victim blocks.

$$RRCV1_c = EIRV * QSTY1 \quad (1)$$

In Equation 1, "EIRV" denotes an error information range value, and "QSTY1" denotes a time at which an address of the first victim block is queued in the first queue 402 (hereinafter efe ed to as a "first queuing time").

The error information range value EIRV may be a value allocated for a predetermined range to which the error information value of each of the first victim blocks belongs. The error information range value EIRV may represent a damage degree of the first victim block. The greater the error information range value EIRV, the higher the damage degree of the first victim block.

According to an embodiment, when the number of error bits is equal to or greater than 0 and less than 80, the error information range value EIRV may be "1". When the number of error bits is equal to or greater than 80 and less than 120, the error information range value EIRV may be "2". When the number of error bits is equal to or greater than 120 and less than 160, the error information range value EIRV may be "3". When the number of error bits is equal to or greater than 160, the error information range value EIRV may be "10".

According to another embodiment, when the number of error steps is equal to or greater than 0 and less than 5, the error information range value EIRV may be "1". When the number of error steps is equal to or greater than 6 and less than 10, the error information range value EIRV may be "2". When the number of error steps is equal to or greater than 10 and less than 20, the error information range value EIRV may be "3". When the number of error steps is equal to or greater than 20, the error information range value EIRV may be "10".

The first queuing time QSTY1 may represent the time at which the address of the first victim block are queued in the first queue 402. For example, an initial value of the first queuing time QSTY1 may be "1". The first queuing time QSTY1 may be updated as necessary.

For example, as a time for which the error information value of the first victim block is queued in the first queue 402 increases, the error information value of the first victim block may increase. The first queuing time QSTY1 may reflect an error information value that may vary with the time for which the first victim block is queued in the first queue 402.

At step S505, the processor 134 may determine whether or not the first queue 402 is filled with address information of the first victim blocks, i.e., whether the first queue 402 is full. That is, the processor 134 may determine whether or not a capacity of the first queue 402 remains.

As a result of the determination at step S505, when the capacity of the first queue 402 remains, i.e., the first queue 402 is not full (that is, "NO" at step S505), the processor 134 may queue the addresses and read reclaim values of the first victim blocks in the first queue 402 at step S507.

At step S509, the processor 134 may rearrange a queuing order of the addresses queued in the first queue 402 based on the first read reclaim values $RRCV1_c$ of the first victim blocks corresponding to the addresses queued in the first queue 402. For example, the queuing order of the addresses queued in the first queue 402 may be rearranged in descending order of the first read reclaim values $RRCV1_c$. The processor 134 may update the first read reclaim values $RRCV1_c$ by updating the first queuing times QSTY1, and rearrange the queuing order of the addresses queued in the first queue 402 based on the updated first read reclaim values $RRCV1_c$.

At step S511, the processor 134 may calculate a sum $RRCV1_{total}$ (hereinafter referred to as a "first sum") of the first read reclaim values $RRCV1_c$ of the first victim blocks corresponding to the addresses queued in the first queue 402.

As a result of the determination at step S505, when the capacity of the first queue 402 does not remain, i.e., the first queue 402 is full (that is, "YES" at step S505), the processor 134 may determine whether or not the second queue 404 is filled with address information of the second victim blocks, i.e., whether the second queue 404 is full, at step S513. That is, the processor 134 may determine whether or not a capacity of the second queue 404 remains.

As a result of the determination at step S513, when the capacity of the second queue 404 remains, i.e., the second queue 404 is not full (that is, "NO" at step S513), the processor 134 may allocate the remaining capacity to the first queue 402 to increase the capacity of the first queue 402 at step S515, and carry out steps S507 to S511.

As a result of the determination at step S513, when the capacity of the second queue 404 does not remain, i.e., the second queue 404 is full (that is, "YES" at step S513), the processor 134 may determine whether or not the first read reclaim values $RRCV1_c$ of the first victim blocks are greater than minimum first read reclaim values $RRCV1_{min}$ of the first victim blocks corresponding to the addresses queued in the first queue 402 at step S517.

As a result of the determination at step S517, when the first read reclaim values $RRCV1_c$ of the first victim blocks are greater than the minimum first read reclaim values $RRCV1_{min}$ of the first victim blocks corresponding to the addresses queued in the first queue 402 (that is, "YES" at step S517), the processor 134 may dequeue the addresses of the first victim blocks having the minimum first read reclaim values $RRCV1_{min}$ from the first queue 402 to secure the capacity of the first queue 402 at step S519, and subsequently carry out steps S507 to S511.

As a result of the determination at step S517, when the first read reclaim values $RRCV1_c$ of the first victim blocks are equal to or less than the minimum first read reclaim values $RRCV1_{min}$ of the first victim blocks corresponding to the addresses queued in the first queue 402 (that is, "NO" at step S517), the processor 134 may queue the addresses of the first victim blocks in the first queue 402 at step S563. At this time, the capacity of the first queue 402 is secured since the processor 134 may control the memory device 150 to selectively perform the read reclaim operation on the first queue 402 and the second queue 404 at step S561, which is to be described below.

At step S533, the processor 134 may calculate a second read reclaim value $RRCV2_c$ of each of the second victim blocks according to Equation 2 below. The second read reclaim value $RRCV2_c$ may represent a priority order of the read reclaim operation performed on each of the second victim blocks.

[Equation 2]

$$RRCV2_c = RCRV * QSTY2 \qquad (2)$$

In Equation 2, "RCRV" denotes a read count range value, and "QSTY2" denotes a time at which an address of the second victim block is queued in the second queue 404 (hereinafter referred to as a "second queuing time").

The read count range value RCRV may be a value allocated for a predetermined range to which the error information value of each of the second victim blocks belongs. The read count range value RCRV may represent a damage degree of the second victim block. The greater the read count range value RCRV, the higher the damage degree of the second victim block.

According to an embodiment, when the read count is equal to or greater than 0 and less than 50000, the read count range value RCRV may be "1". When the read count is equal to or greater than 50000 and less than 100000, the read count range value RCRV may be "2". When the read count is equal to or greater than 100000 and less than 200000, the read count range value RCRV may be "3". When the read count is equal to or greater than 200000, the read count range value RCRV may be "10".

The second queuing time QSTY2 may represent the time at which the address of the second victim block are queued in the second queue 402. For example, an initial value of the second queuing time QSTY2 may be "1". The second queuing time QSTY2 may be updated as necessary.

For example, as a time for which the read count of the first victim block is queued in the second queue 404 increases, the read count of the second victim block may increase. The second queuing time QSTY2 may reflect a read count that may vary with the time for which the second victim block is queued in the second queue 404.

At step S535, the processor 134 may determine whether or not the second queue 404 is filled with address information of the second victim blocks, i.e., whether the second queue 404 is full. That is, the processor 134 may determine whether or not a capacity of the second queue 404 remains.

As a result of the determination in step S535, when the capacity of the second queue 404 remains, i.e., the second queue 404 is not full (that is, "NO" at step S535), the processor 134 may queue the addresses and read reclaim values of the second victim blocks in the second queue 404 at step S537.

At step S539, the processor 134 may rearrange a queuing order of the addresses queued in the second queue 404 based on the second read reclaim values $RRCV2_c$ of the second victim blocks corresponding to the addresses queued in the second queue 404. For example, the queuing order of the addresses queued in the second queue 404 may be rearranged in descending order of the second read reclaim values $RRCV2_c$. The processor 134 may update the second read reclaim values $RRCV2_c$ by updating the second queuing times QSTY2, and rearrange the queuing order of the addresses queued in the second queue 404 based on the updated second read reclaim values $RRCV2_c$.

At step S541, the processor 134 may calculate a sum $RRCV2_{total}$ (hereinafter referred to as a "second sum") of the second read reclaim values $RRCV2_c$ of the second victim blocks corresponding to the addresses queued in the second queue 404.

As a result of the determination at step S535, when the capacity of the second queue 404 does not remain, i.e., the second queue 404 is full (that is, "YES" at step S535), the processor 134 may determine whether or not the first queue 402 is filled with the address information of the first victim blocks at step S543. That is, the processor 134 may determine whether or not a capacity of the first queue 402 remains.

As a result of the determination at step S543, when the capacity of the first queue 402 remains, i.e., the first queue 402 is not full (that is, "NO" at step S543), the processor 134 may allocate the remaining capacity of the first queue 402 to the second queue 404 to increase the capacity of the second queue 404 at step S545, and carry out steps S537 to S541.

As a result of the determination at step S543, when the capacity of the first queue 402 does not remain, i.e., the first queue 402 is full (that is, "YES" at step S543), the processor 134 may determine whether or not the second read reclaim values $RRCV2_c$ of the second victim blocks are greater than minimum second read reclaim values $RRCV2_{min}$ of the second victim blocks corresponding to the addresses queued in the second queue 404 at step S547.

As a result of the determination at step S547, when the second read reclaim values $RRCV2_c$ of the second victim blocks are greater than the minimum second read reclaim values $RRCV2_{min}$ of the second victim blocks corresponding to the addresses queued in the second queue 404 (that is, "YES" at step S547), the processor 134 may dequeue the addresses of the second victim blocks having the minimum second read reclaim values $RRCV2_{min}$ from the second queue 404 to secure the capacity of the second queue 404 at step S549, and subsequently carry out steps S537 to S541.

As a result of the determination at step S547, when the second read reclaim values $RRCV2_c$ of the second victim blocks are equal to or less than the minimum second read reclaim values $RRCV2_{min}$ of the second victim blocks corresponding to the addresses queued in the second queue 404 (that is, "NO" at step S547), the processor 134 may queue the addresses of the second victim blocks in the second queue 404 at step S563. At this time, the capacity of the second queue 404 is secured since the processor 134 may control the memory device 150 to selectively perform the read reclaim operation on the first queue 402 and the second queue 404 at step S561 which is to be described below.

Subsequent to steps S511 and S541 or any of steps S511 and S541, at step S561, the processor 134 may control the memory device 150 to selectively perform the read reclaim operation on the first victim blocks corresponding to the addresses queued in the first queue 402 and the second victim blocks corresponding to the addresses queued in the second queue 404 in accordance with the queuing orders of the addresses rearranged in the first queue 402 and the second queue 404 based on the first sum $RRCV1_{total}$ and the second sum $RRCV2_{total}$.

According to an embodiment, the processor 134 may control the memory device 150 to selectively perform the read reclaim operation on the first victim blocks corresponding to the addresses queued in the first queue 402 and the second victim blocks corresponding to the addresses queued in the second queue 404 in accordance with a ratio of the first sum $RRCV1_{total}$ and the second sum $RRCV2_{total}$.

For example, when the ratio of the first sum $RRCV1_{total}$ and the second sum $RRCV2_{total}$ is 2 to 1, the processor 134 may control the memory device 150 to sequentially perform the read reclaim operation on two first victim blocks having a highest priority, that is, two first victim blocks having a maximum first read reclaim value $RRCV1_c$ among the first victim blocks corresponding to the addresses queued in the first queue 402 and to perform the read reclaim operation on one second victim block having a highest priority, that is, one second victim block having a maximum second read reclaim value $RRCV2_c$ among the second victim blocks corresponding to the addresses queued in the second queue 404.

One or more addresses of the first and second victim blocks queued in one or more queues of the first and second queues 402 and 404 may be dequeued through the read reclaim operation of step S561, and therefore, capacities of the queues for queuing additional victim block addresses may be secured.

When the first read reclaim values $RRCV1_c$ of the first victim blocks are equal to or less than the minimum first read reclaim values $RRCV1_{min}$ of the first victim blocks corresponding to the addresses queued in the first queue 402 (that is, "NO" at step S517) as a result of the determination at step S517, and when the second read reclaim values $RRCV2_c$ of the second victim blocks are equal to or less than the minimum second read reclaim values $RRCV2_{min}$ of the second victim blocks corresponding to the addresses queued in the second queue 404 (that is, "NO" at step S547) as a result of the determination at step S547, the processor 134 may control the memory device 150 to queue the addresses of the first victim blocks and the addresses of the second victim blocks in one or more queues of the first and second queues 402 and 404 at step S563, which are secured by selectively performing the read reclaim operation on the first and second queues 402 and 404 at step S561.

As described above, in accordance with the embodiment of the present invention, the controller 130 may determine the priority order of the first and second victim blocks queued in the first and second queues 402 and 404 based on the read reclaim values $RRCV1_c$ and $RRCV2_c$. Consequently, the read reclaim operation may be performed according to the determined priority order.

Hereafter, various data processing systems and electronic devices to which the memory system 110 including the memory device 150 and the controller 130, as described above with reference to FIGS. 1 to 4, in accordance with the embodiment of the present disclosure will be described in detail with reference to FIGS. 5 to 13.

Figure 5:
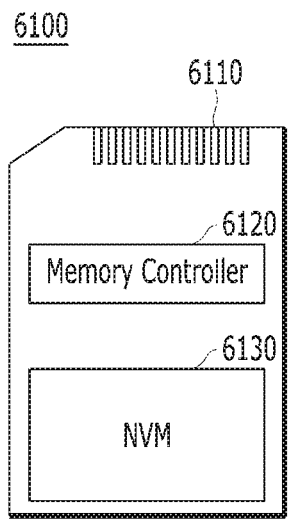
FIGS. 5 to 13 are diagrams schematically illustrating application examples of the data processing system, in accordance with various embodiments of the present invention.

FIG. 5 is a diagram schematically illustrating an example of the data processing system including the memory system in accordance with the present embodiment. FIG. 5 schematically illustrates a memory card system 6100 to which the memory system in accordance with the present embodiment is applied.

Referring to FIG. 5, the memory card system 6100 may include a memory controller 6120, a memory device 6130 and a connector 6110.

More specifically, the memory controller 6120 may be connected to the memory device 6130 embodied by a nonvolatile memory (NVM), and configured to access the memory device 6130. For example, the memory controller 6120 may be configured to control read, write, erase and background operations of the memory device 6130. The memory controller 6120 may be configured to provide an interface between the memory device 6130 and a host (not shown), and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, as shown in FIG. 1, the memory controller 6120 may include a random access memory (RAM), a processing unit, a host interface, a memory interface and an error correction unit.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired and/or wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secure data (SD) card (e.g., SD, miniSD, microSD and SDHC) and a universal flash storage (UFS).

Figure 6:
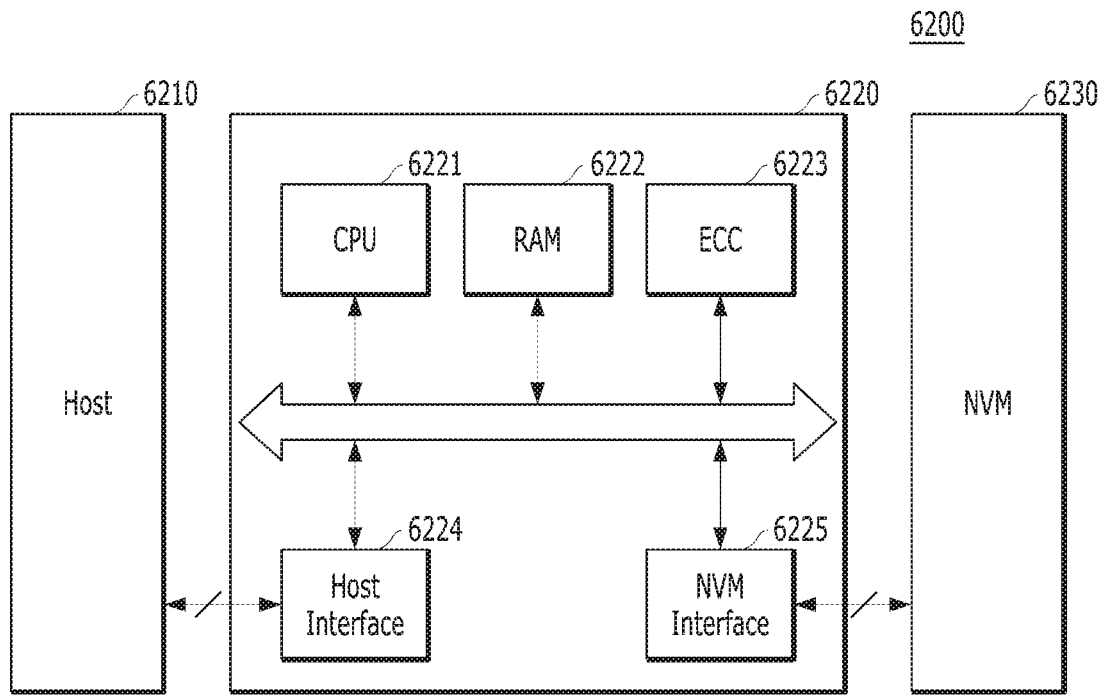

FIG. 6 is a diagram schematically illustrating an example of a data processing system 6200 including the memory system in accordance with the present embodiment.

Referring to FIG. 6, the data processing system 6200 may include a memory device 6230 having one or more nonvolatile memories (NVMs) and a memory controller 6220 for controlling the memory device 6230. The data processing system 6200 may serve as a storage medium such as a memory card (e.g., CF, SD, micro-SD or the like) or USB device, as described with reference to FIGS. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of a host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit and receive data to and from the host 6210 through the host interface 6224, and transmit and receive data to and from the memory device 6230 through the NVM interface 6225. The host interface 6224 may be connected to the host 6210 through a parallel advanced technology attachment (PATA) bus, serial advanced technology attachment (SATA) bus, small computer system interface (SCSI), universal serial bus (USB), peripheral component interconnect-express (PCIe) or NAND interface. The memory controller 6220 may have a wireless communication function with a mobile communication protocol such as wireless fidelity (WiFi) or Long Term Evolution (LTE). The memory controller 6220 may be connected to an external device, for example, the host 6210 or another external device, and then transmit and receive data to and from the external device. In particular, as the memory controller 6220 is configured to communicate with the external device through one or more of various communication protocols, the memory system and the data processing system in accordance with the present embodiment may be applied to wired and/or wireless electronic devices or particularly a mobile electronic device.

Figure 7:
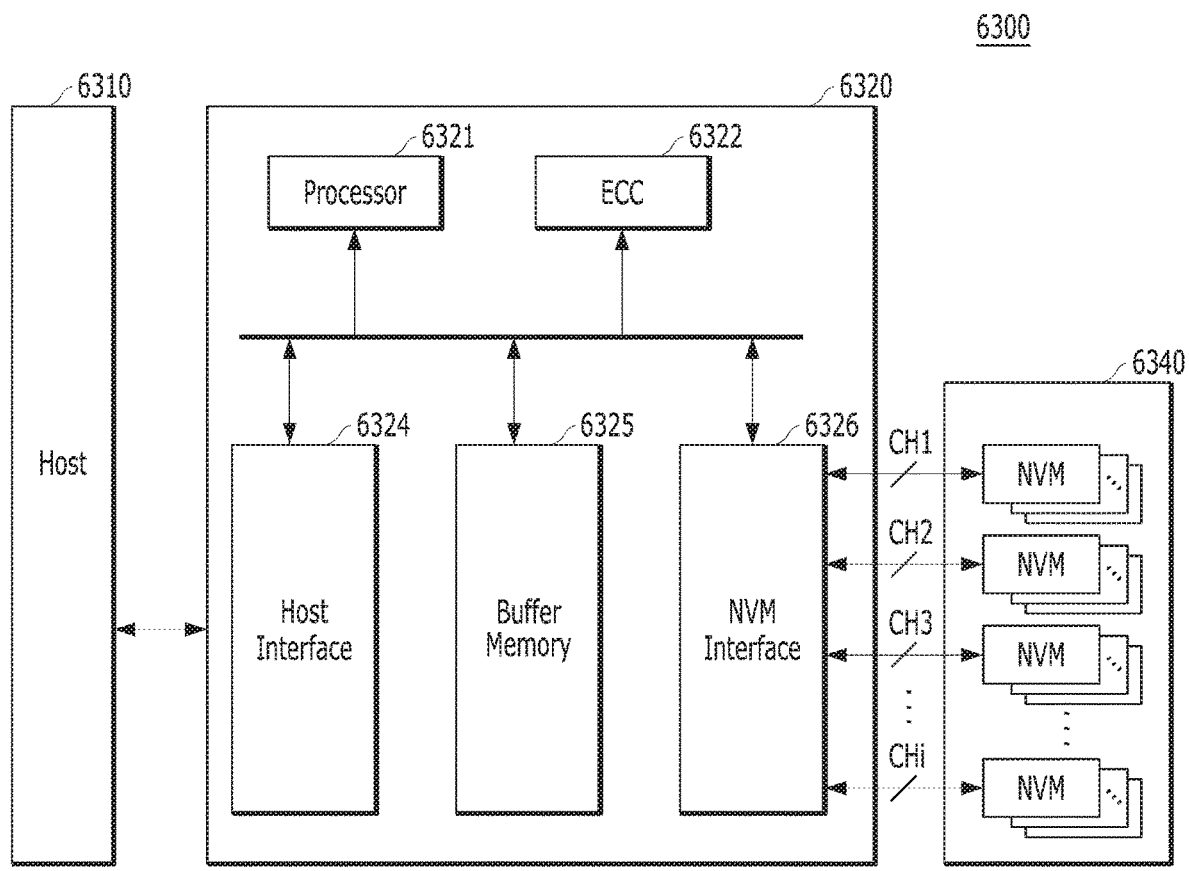

FIG. 7 is a diagram schematically illustrating an example of the data processing system including the memory system in accordance with the present embodiment. FIG. 7 schematically illustrates a solid state drive (SSD) 6300 to which the memory system in accordance with the present embodiment is applied.

Referring to FIG. 7, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). For convenience of description, FIG. 7 illustrates that the buffer memory 6325 exists in the controller 6320. However, the buffer memory 6325 may exist in an external of the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 is applied may be provided to embody a data processing system, for example, a Redundant Array of Independent Disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 8:
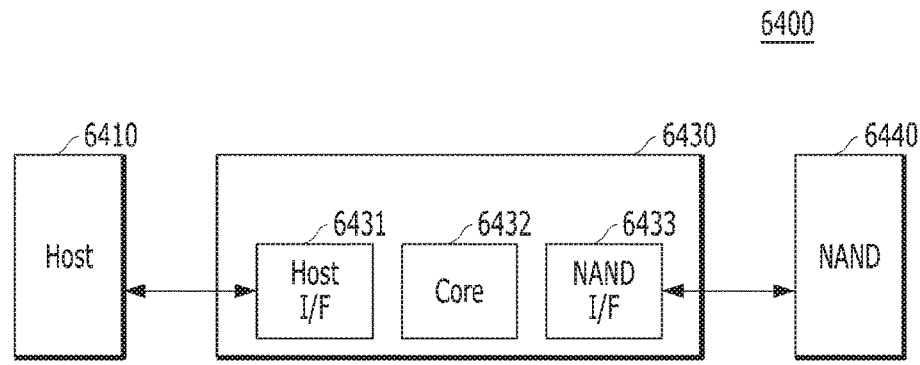

FIG. 8 is a diagram schematically illustrating an example of the data processing system including the memory system in accordance with the present embodiment. FIG. 8 schematically illustrates an embedded Multi-Media Card (eMMC) 6400 to which the memory system in accordance with the present embodiment is applied.

Referring to FIG. 8, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control overall operations of the eMMC 6400. The host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 9 to 12 are diagrams schematically illustrating various examples of the data processing system including the memory system in accordance with the present embodiment. FIGS. 9 to 12 schematically illustrate Universal Flash Storage (UFS) systems to which the memory system in accordance with the present embodiment is applied.

Referring to FIGS. 9 to 12, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices or particularly mobile electronic devices. The UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols. The UFS devices 6520, 6620, 6720 and 6820 and the UFS cards 6530, 6630, 6730 and 6830 may be embodied by the memory system 110 illustrated in FIGS. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 6 to 8, and the UFS cards 6530, 6630, 6730 and 6830 may be embodied in the form of the memory card system 6100 described with reference to FIG. 5.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, a universal storage bus (USB) Flash Drives (UFDs), a multimedia card (MMC), a secure digital (SD), mini-SD, and micro-SD.

Figure 9:
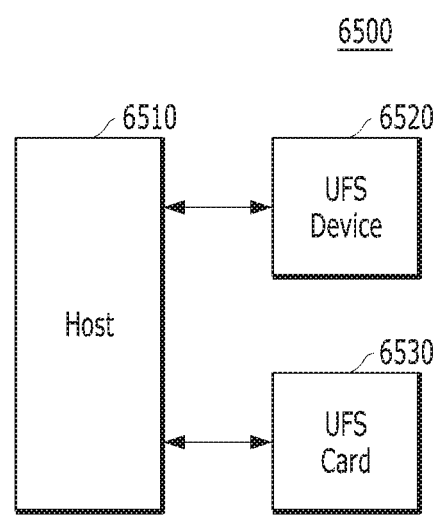

In the UFS system 6500 illustrated in FIG. 9, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520.

Figure 10:
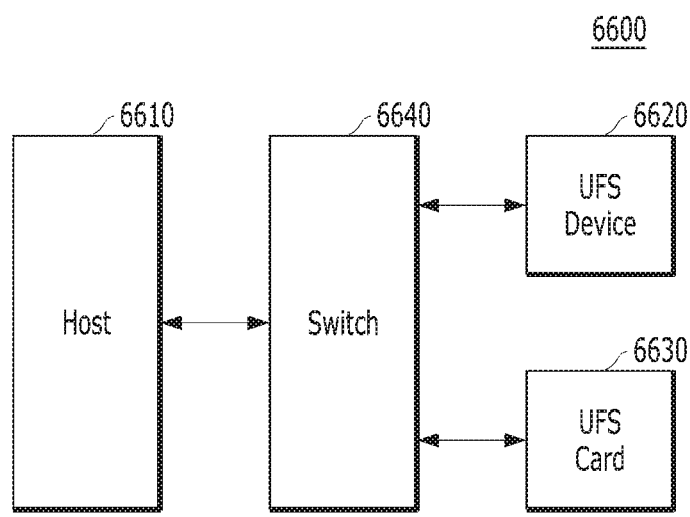

In the UFS system 6600 illustrated in FIG. 10, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 11:
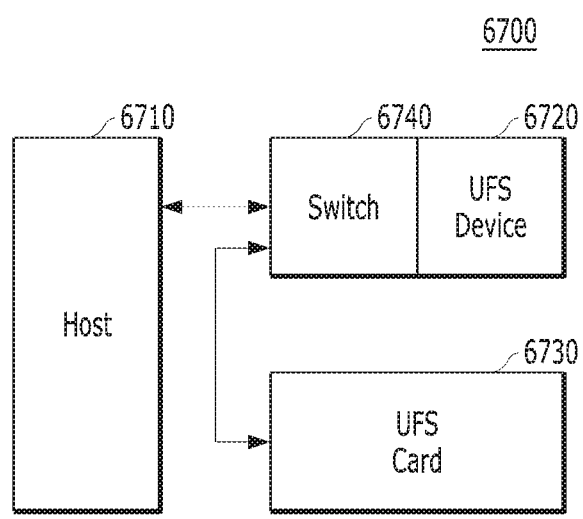

In the UFS system 6700 illustrated in FIG. 11, each of the host 6710, the UFS device 6720 and the UFS card 6730 may include UniPro.

The host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 12:
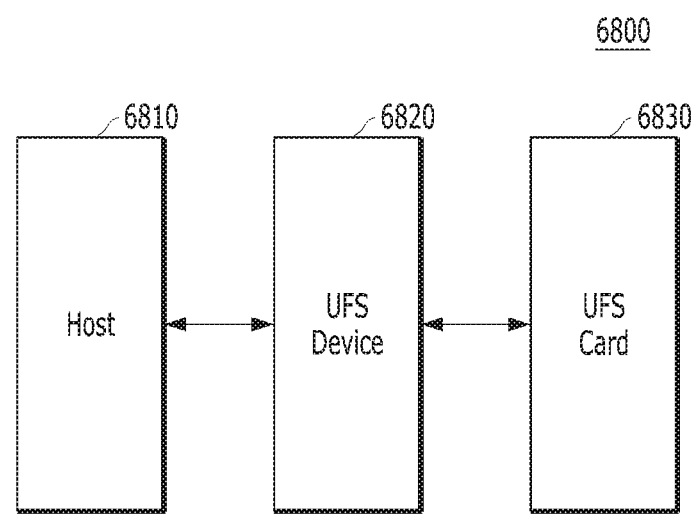

In the UFS system 6800 illustrated in FIG. 12, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 13:
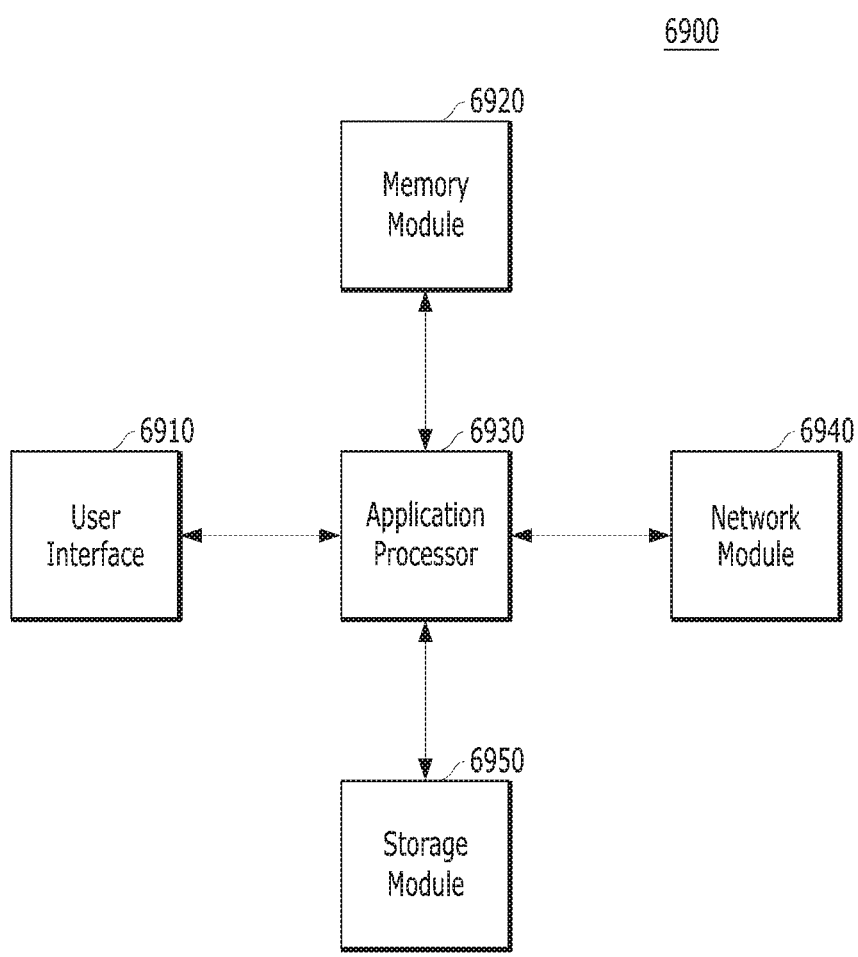

FIG. 13 is a diagram schematically illustrating another example of the data processing system including the memory system in accordance with an embodiment of the present invention. FIG. 13 is a diagram schematically illustrating a user system 6900 to which the memory system in accordance with the present embodiment is applied.

Referring to FIG. 13, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, a low power DDR (LPDDR) SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 7 to 12.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

In accordance with the embodiments of the present invention, the read reclaim operation may be performed according to a priority order of victim blocks, whereby damage of the memory device may be rapidly recovered.

While the present invention has been described with respect to specific embodiments, it will be apparent to those skilled in the art that various changes and modifications may be made without departing from the spirit and scope of the invention as defined in the following claims.

What is claimed is:

1. A memory system, comprising:
a plurality of memory blocks;
first and second queues; and
a controller suitable for queuing first victim blocks whose error information value is equal to or greater than a threshold value among the memory blocks in the first queue, queuing second victim blocks whose read count is equal to or greater than a threshold value in the second queue, rearranging a priority order of the first and second victim blocks queued in the first and second queues based on read reclaim values, and performing a read reclaim operation on the first and second victim blocks based on the priority order.

2. The memory system of claim 1, wherein the controller determines the read reclaim values of the first victim blocks by multiplying an error information range value by a first queuing time, and determines the read reclaim values of the second victim blocks by multiplying a read count range value by a second queuing time.

3. The memory system of claim 2, wherein the first queuing time includes a time at which the first victim blocks are queued in the first queue, and the second queuing time includes a time at which the second victim blocks are queued in the second queue.

4. The memory system of claim 1, wherein the controller queues the read reclaim values together when queueing the first and second victim blocks in the first and second queue, respectively.

5. The memory system of claim 4, wherein the controller updates the queued read reclaim values by updating the first and second queuing times.

6. The memory system of claim 5, wherein the controller rearranges the priority order of the first and second blocks queued in the first and second queues in descending order of the updated read reclaim values.

7. The memory system of claim 1, wherein when a capacity of any one of the first and second queues remains, the controller allocates the capacity of the corresponding queue to the other queue.

8. The memory system of claim 1, wherein the controller sequentially performs the read reclaim operation on the first victim blocks queued in the first queue and the second victim blocks queued in the second queue based on a ratio of a first sum and a second sum.

9. The memory system of claim 8, wherein the first sum includes a sum of the read reclaim values of the first victim blocks queued in the first queue, and the second sum includes a sum of the read reclaim values of the second victim blocks queued in the second queue.

10. The memory system of claim 1, wherein the error information value includes any one of a number of error bits or a number of error steps.

11. An operating method of a memory system, comprising:
queuing first victim blocks whose error information value is equal to or greater than a threshold value among a plurality of memory blocks in a first queue and queuing second victim blocks whose read count is equal to or greater than a threshold value in a second queue;
rearranging a priority order of the first and second victim blocks queued in the first and second queues based on read reclaim values; and
performing a read reclaim operation on the first and second victim blocks based on the priority order.

12. The operating method of claim 11, wherein the read reclaim values of the first victim blocks are determined by multiplying an error information range value by a first queuing time, and the read reclaim values of the second victim blocks are determined by multiplying a read count range value by a second queuing time.

13. The operating method of claim 12, wherein the first queuing time includes a time at which the first victim blocks are queued in the first queue, and the second queuing time includes a time at which the second victim blocks are queued in the second queue.

14. The operating method of claim 11, wherein the read reclaim values are queued together when the first and second victim blocks are queued in the first and second queue, respectively.

15. The operating method of claim 14, further comprising:
updating the queued read reclaim values by updating the first and second queuing times.

16. The operating method of claim 15, wherein the priority order of the first and second blocks queued in the first and second queues is rearranged in descending order of the updated read reclaim values.

17. The operating method of claim 11, further comprising:
Allocating, when a capacity of any one of the first and second queues remains, the capacity of the corresponding queue to the other queue.

18. The operating method of claim 11, wherein the read reclaim operation are sequentially performed on the first victim blocks queued in the first queue and the second victim blocks queued in the second queue based on a ratio of a first sum and a second sum.

19. The operating method of claim 18, wherein the first sum includes a sum of the read reclaim values of the first victim blocks queued in the first queue, and the second sum includes a sum of the read reclaim values of the second victim blocks queued in the second queue.

20. The operating method of claim 11, wherein the error information value includes any one of a number of error bits or a number of error steps.

* * * * *